US009589968B2

(12) United States Patent
Denorme et al.

(10) Patent No.: US 9,589,968 B2
(45) Date of Patent: Mar. 7, 2017

(54) METHOD FOR PRODUCING ONE-TIME-PROGRAMMABLE MEMORY CELLS AND CORRESPONDING INTEGRATED CIRCUIT

(71) Applicant: STMicroelectronics SA, Montrouge (FR)

(72) Inventors: Stéphane Denorme, Crolles (FR); Philippe Candelier, St. Mury Monteymond (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/952,662

(22) Filed: Nov. 25, 2015

(65) Prior Publication Data

US 2016/0343720 A1    Nov. 24, 2016

(30) Foreign Application Priority Data

May 19, 2015    (FR) .................................... 15 54457

(51) Int. Cl.
| H01L 27/112 | (2006.01) |
| H01L 29/66 | (2006.01) |
| H01L 21/28 | (2006.01) |
| H01L 29/40 | (2006.01) |
| H01L 29/49 | (2006.01) |

(52) U.S. Cl.
CPC .. *H01L 27/11206* (2013.01); *H01L 21/28097* (2013.01); *H01L 29/401* (2013.01); *H01L 29/4975* (2013.01); *H01L 29/66181* (2013.01)

(58) Field of Classification Search
CPC ........... H01L 27/11206; H01L 29/4975; H01L 29/401; H01L 21/28097; H01L 29/66181
See application file for complete search history.

(56) References Cited

U.S. PATENT DOCUMENTS

| 6,828,632 | B2* | 12/2004 | Bhattacharyya ........ H01L 21/84 257/288 |
| 7,995,369 | B2* | 8/2011 | Minami ................ H01L 27/101 257/296 |
| 8,748,258 | B2* | 6/2014 | Cheng ............... H01L 29/66181 257/310 |
| 8,927,422 | B2* | 1/2015 | Alptekin ........... H01L 21/28518 438/300 |
| 2009/0224321 | A1 | 9/2009 | Tsuchiya |
| 2011/0127591 | A1 | 6/2011 | Kubota et al. |
| 2014/0203363 | A1* | 7/2014 | Adam ............... H01L 29/66742 257/347 |
| 2014/0231895 | A1 | 8/2014 | Rothleitner |

FOREIGN PATENT DOCUMENTS

WO    2006111888 A1    10/2006

* cited by examiner

*Primary Examiner* — William Coleman
(74) *Attorney, Agent, or Firm* — Slater Matsil, LLP

(57) ABSTRACT

An integrated circuit includes a silicon on insulator substrate having a semiconductor film located above a buried insulating layer. At least one memory cell of the one-time-programmable type includes an MOS capacitor having a first electrode region including a gate region at least partially silicided and flanked by an insulating lateral region, a dielectric layer located between the gate region and the semiconductor film, and a second electrode region including a silicided zone of the semiconductor film, located alongside the insulating lateral region and extending at least partially under the dielectric layer.

21 Claims, 6 Drawing Sheets

US 9,589,968 B2

METHOD FOR PRODUCING ONE-TIME-PROGRAMMABLE MEMORY CELLS AND CORRESPONDING INTEGRATED CIRCUIT

This application claims priority to French Application No. 1554457, filed on May 19, 2015, which application is hereby incorporated herein by reference.

TECHNICAL FIELD

Modes of implementation and embodiments of the invention relate to one-time-programmable memory cells, known to the person skilled in the art by the acronym "OTP."

BACKGROUND

A memory cell of the one-time-programmable type generally comprises a capacitor, for example of the MOS type, possessing a dielectric layer between its two electrodes and operates as an anti-fuse whose state is modified in an irreversible manner, for example through breakdown of the dielectric layer, by applying a high programming voltage to the memory cell, in such a way that the memory cell passes from a non-conducting state to a conducting state, this amounting to changing its resistance.

In advanced CMOS technologies, elevated source and drain regions of the transistors, for example planar CMOS transistors, FinFET transistors or transistors produced on a substrate on insulator, for example a substrate of the FDSOI ("Fully Depleted Silicon-On-Insulator") type, are formed by epitaxy.

A substrate of the silicon on insulator type comprises a semiconductor film, made for example of silicon or silicon alloy, such as a silicon-germanium alloy, situated above a buried insulating layer, commonly referred to by the acronym "BOX" ("Buried OXide") itself situated above a carrier substrate, for example a semiconductor well.

In an FDSOI substrate, the silicon film is fully depleted (the semiconductor material is intrinsic) and has a particularly low thickness of the order of a few nanometres.

The use of elevated source and drain regions makes it possible to solve problems of reliability, such as the hot carrier reliability (HCI: Hot Carrier Injection) of the transistors and also the problem of the mechanical resilience of the metal silicide.

In general, the MOS capacitors of OTP memory cells are produced jointly with the MOS transistors by using similar method steps.

However, these epitaxied elevated regions do not have any impact on the performance of the MOS capacitors, both as regards the breakdown of the dielectric layer, and as regards the reading voltage, the leakage of the capacitor or else others of these electrical characteristics.

SUMMARY

As noted above, elevated source and drain regions are utilized with certain integrated circuits. However, these epitaxied elevated regions do not have any impact on the performance of the MOS capacitors in an OPT, both as regards the breakdown of the dielectric layer, and as regards the reading voltage, the leakage of the capacitor or else others of these electrical characteristics.

Thus, according to one mode of implementation and embodiment, it is proposed to improve, especially at the reading level, the performance of the MOS capacitors produced jointly with MOS transistors, the formation of whose source and drain regions comprises an epitaxy of a semiconductor material on the basis of one and the same SOT, in particular FDSOI, substrate.

According to one aspect, there is proposed a method, comprising a production of at least one memory cell of the one-time-programmable type that can be used for producing an MOS capacitor in and/or on a semiconductor film of a substrate of the silicon on insulator type. A first electrode region is formed by at least partial silicidation of an insulated gate region resting on the semiconductor film and flanked by an insulating lateral region. A second electrode region is formed by silicidation of a zone of the semiconductor film, situated alongside the insulating lateral region. The zone of the semiconductor film has no previous epitaxy process formed before the silicidation.

Thus, the fact of directly siliciding the semiconductor film allows diffusion of the silicided regions under the gate dielectric, thereby decreasing the read-access resistance and making it possible to apply a lower reading voltage.

The dielectric's breakdown performance is also improved (reduced breakdown voltage and/or decreased breakdown time).

Whether or not the silicided regions join up under the dielectric layer depends on the gate length.

Moreover, still greater effectiveness is obtained when the gate region is fully silicided.

The method can also be used in the production of a MOS transistor, the formation of whose source and drain regions comprises an epitaxy of a semiconductor material on the semiconductor film. In this case, the formation of the second electrode region comprises a protection of the semiconductor film zone by at least one insulating layer during the epitaxy of the source and drain regions.

The substrate can be of the fully depleted silicon on insulator type.

According to another aspect, an integrated circuit comprises a substrate of the silicon on insulator type possessing a semiconductor film located above a buried insulating layer. A memory cell of the one-time-programmable type comprises an MOS capacitor having a first electrode region including a gate region at least partially silicided and flanked by an insulating lateral, a dielectric layer situated between the gate region and the semiconductor film, and a second electrode region including a silicided zone of the semiconductor film, situated alongside the insulating lateral region and extending at least partially under the dielectric layer.

Advantageously, the silicided zone of the semiconductor film can extend fully under the dielectric layer.

The integrated circuit can furthermore comprise at least one MOS transistor having elevated source and drain regions.

The substrate can for example be of the fully depleted silicon on insulator type.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION OF ILLUSTRATIVE EMBODIMENTS

Figure 1:
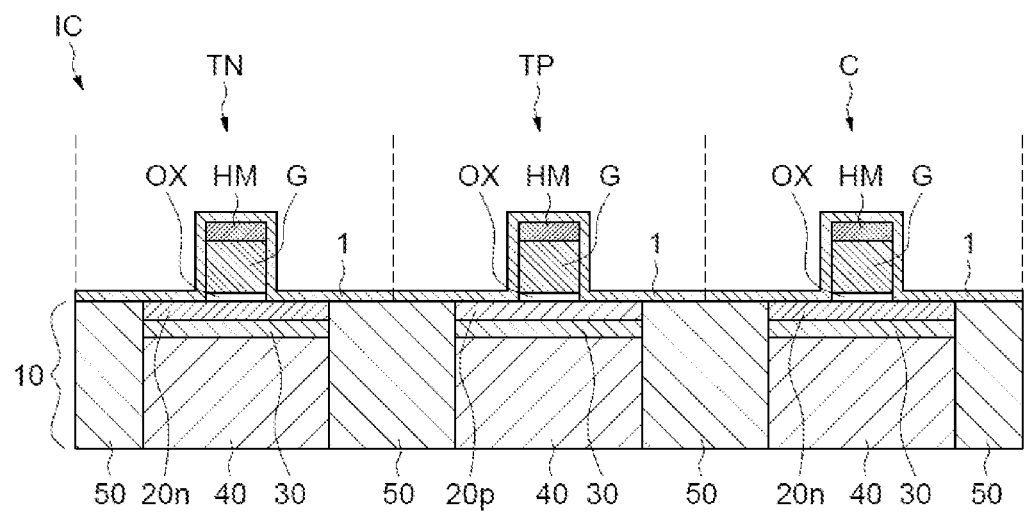
FIGS. 1 to 11 schematically illustrate modes of implementation and embodiments of the invention.

In FIG. 1, the reference IC refers to an integrated circuit in which one wishes to produce an MOS capacitor C jointly with an nMOS transistor TN and with a pMOS transistor TP on one and the same semiconductor substrate of the fully depleted silicon on insulator type 10.

This substrate comprises here a semiconductor thin film 20n and 20p typically possessing a thickness of the order of a few nanometers and resting on a buried oxide layer 30, commonly referred to by the person skilled in the art by the term "BOX". This buried oxide layer 30 is typically made of silicon dioxide and itself rests on a carrier substrate 40 which can be formed by wells.

The substrate 10 furthermore comprises insulating regions comprising for example shallow trenches 50 (STI: "Shallow Trench Isolation") that mutually isolate the nMOS transistor TN, the pMOS transistor TP and the capacitor C.

Depending on the type of conductivity of the nMOS or pMOS transistors, the semiconductor thin film can comprise a hetero-material and can be doped with dopants of type N or of type P or else even be undoped. The capacitor C rests here on a thin film of the same type as that used for the nMOS transistors. Of course, it would also be possible for it to rest on a thin film of the same type as that used for the pMOS transistors.

As illustrated in FIG. 1, gate regions G insulated from the substrate 10 by a dielectric layer OX advantageously comprising a material with a large dielectric constant K ("high-K" materials) are firstly formed above the substrate 10, in a conventional manner known per se.

The gate region G comprises for example above the layer OX a polysilicon layer.

One is dealing here typically with a "gate first" type architecture since the gate region G is formed before the production of the elevated source and drain regions.

A hard mask layer HM, made for example of silicon nitride, protects each gate region G from the posterior steps which will now be described.

A compliant deposition of a first layer 1 comprising a first insulating material is carried out firstly for example by atomic layer deposition commonly known to the person skilled in the art by the acronym "ALD." This first insulating material can for example be silicon nitride and its thickness is for example of the order of 10 nm.

Figure 2:
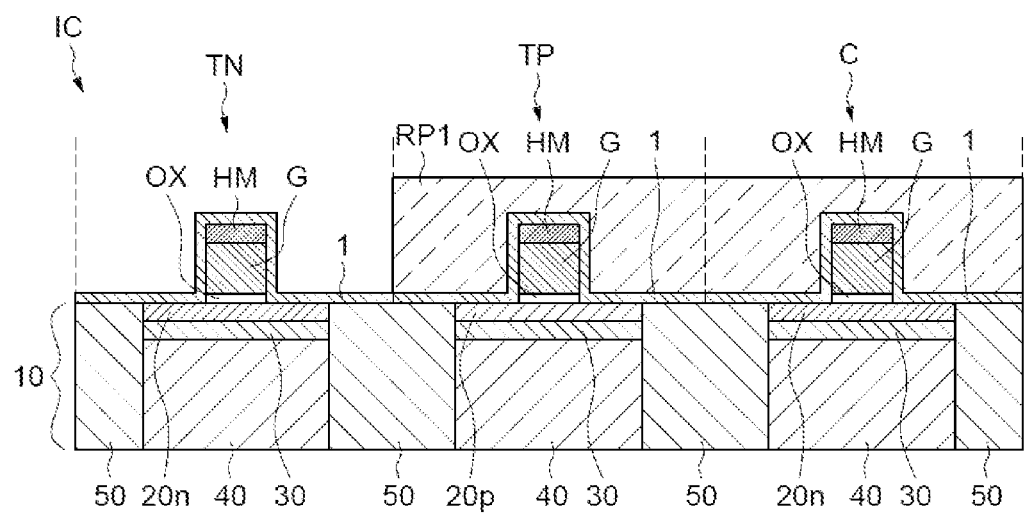

For the production of the elevated source and drain regions of the nMOS transistor TN, the transistor TP and the capacitor C are protected by a resin block RP1 formed conventionally by photolithography, as illustrated in FIG. 2.

Next, a first anisotropic etching of the first layer 1 is performed (FIG. 3) so as to uncover the semiconductor film 20n and form a first insulating layer CI1 on the flanks of the insulated gate region G of the nMOS transistor TN. This selective anisotropic etching down to the silicon layer can be a dry etching of the reactive ion etching ("RIE") type well known to the person skilled in the art.

The thickness of the first insulating layer CI1 is, for example, equal to 6 nm.

The resin block RP1 is thereafter removed and a pre-epitaxy treatment for cleaning the thin film 20n is for example performed on either side of the gate region G of the nMOS transistor TN.

Figure 3:
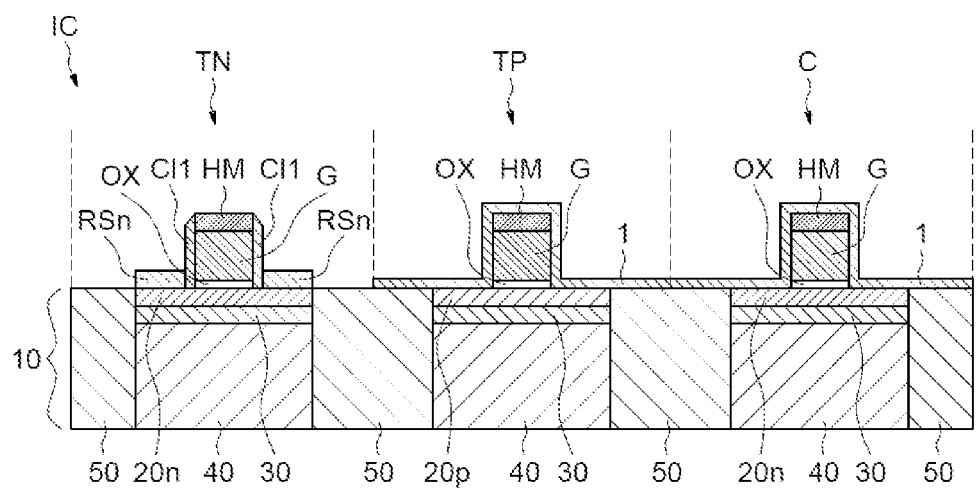

Next, as illustrated in FIG. 3, an epitaxy of an N-doped semiconductor material, for example SiCP, is undertaken on the semiconductor film 20n so as to form elevated source and drain regions RSn disposed on the first insulating layer CI1 on each side of the gate region G of the nMOS transistor.

Figure 4:
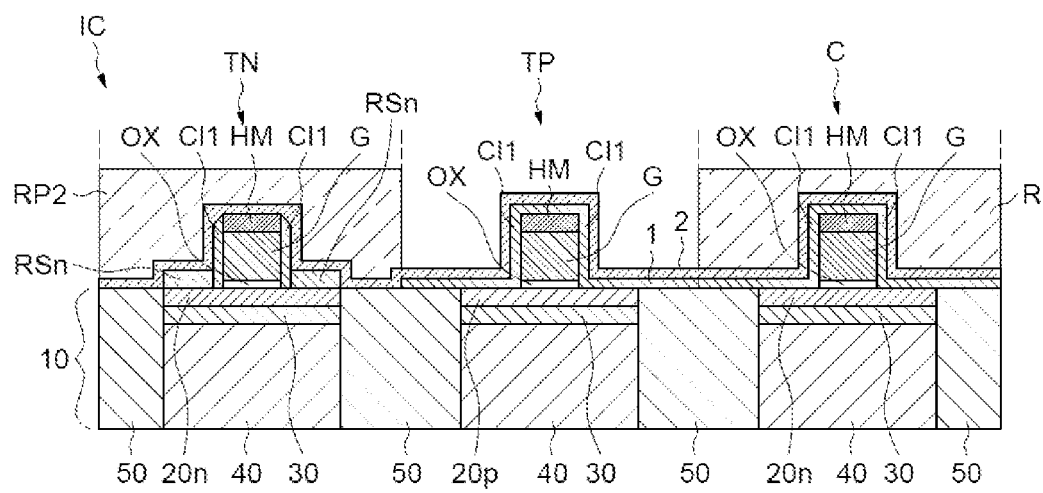

The production of the elevated source and drain regions for the pMOS transistor TP is thereafter prepared (FIG. 4).

A compliant deposition of a second protection layer 2 comprising a second insulating material is firstly carried out on the structure of FIG. 3, for example, by a deposition of ALD type. This second insulating material can for example be silicon dioxide SiO2, and the thickness of the layer 2 can be of the order of 7 nm.

Two resin blocks RP2 are thereafter formed by photolithography above the nMOS transistor and the capacitor C.

A second anisotropic etching of the second layer 2 and of the first layer 1 in the region of the pMOS transistor TP is performed thereafter so as to uncover the semiconductor film 20p and form a second insulating layer CI2 on the flanks of the first insulating layer CI1 resting on the insulated gate region G of the pMOS transistor TP.

The thickness of the second insulating layer CI2 is for example of the order of 3 nm.

Figure 5:
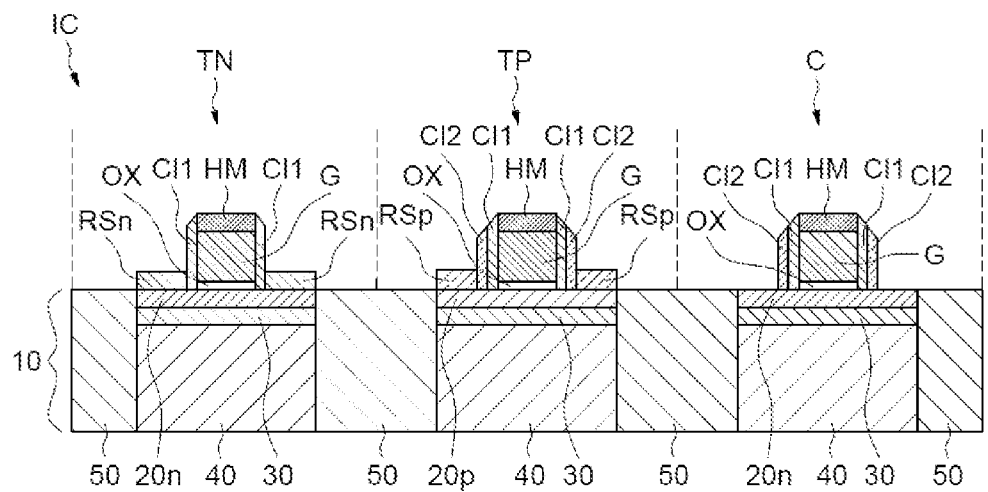

Subsequent to withdrawal of the resin blocks RP2, an epitaxy of a P-doped semiconductor material, for example SiGeB, is performed on the semiconductor film 20p so as to form elevated source and drain regions RSp on either side of the gate region G of the pMOS transistor TP and resting on the second insulating layer CI2, as is illustrated in FIG. 5.

It should be noted that the source and drain regions RSn of the nMOS transistor TN and the semiconductor film zone situated on either side of the gate region G of the capacitor C are respectively protected by the second protection layer 2 and by the layers 1 and 2, during the epitaxy of the source and drain regions of the pMOS transistor TP.

Thus, after withdrawal of the protection layers 1 and 2 by virtue of an etching step of RIE type, an nMOS transistor TN and a pMOS transistor TP having elevated source and drain regions are obtained. On the other hand, as illustrated in FIG. 5, the capacitor C does not possess any epitaxied elevated regions on either side of its gate region G.

Figure 6:
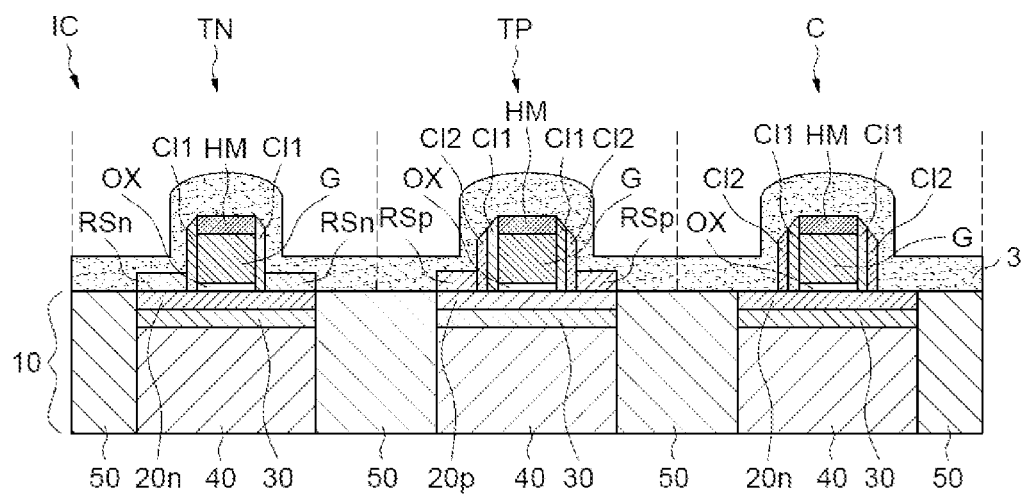

Next, a third protection layer 3, made for example of silicon dioxide, is deposited on the structure of FIG. 5 (FIG. 6).

Figure 7:
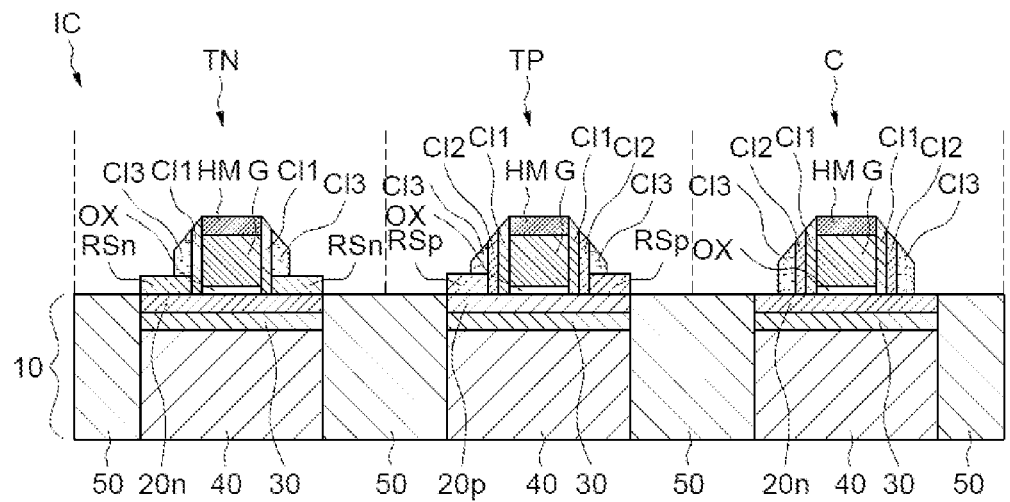

A third anisotropic etching of the third layer 3 is performed thereafter so as to form a third insulating layer CI3 resting on the flanks of the second insulating layer CI2 (FIG. 7).

Figure 8:
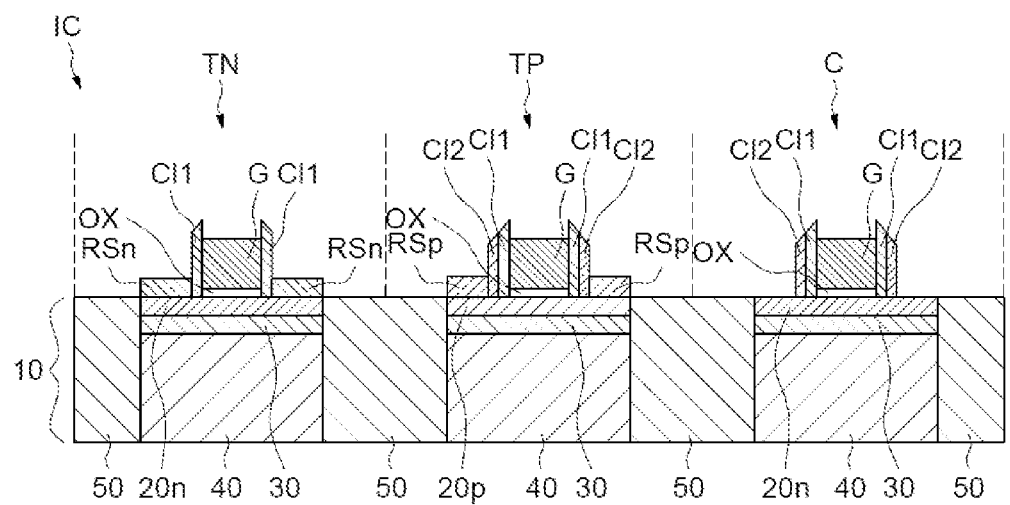

The silicon nitride hard mask HM is removed by wet etching. A surface cleaning is performed thereafter by means of hydrofluoric acid so as to obtain the structure as illustrated in FIG. 8.

Figure 9:
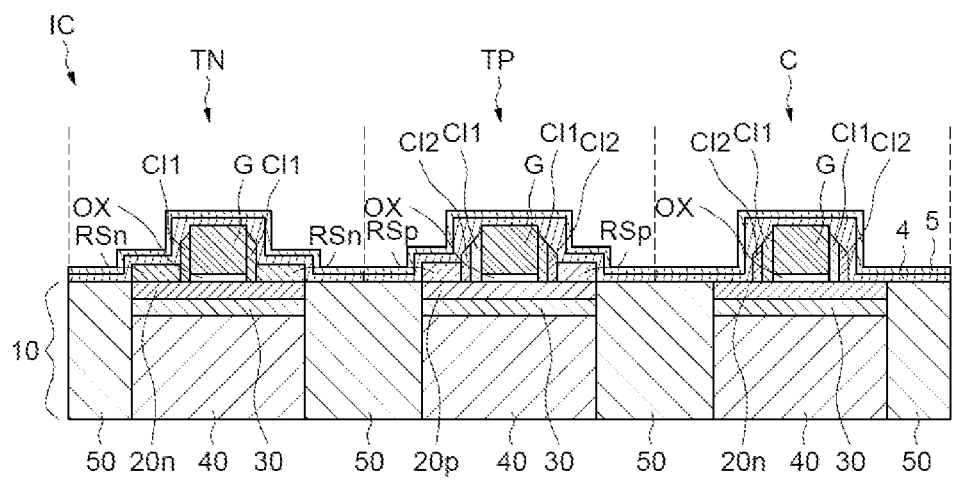

Before undertaking the silicidation step, the whole of the integrated circuit is covered with a bilayer 4, 5 (oxide—nitride for example) known to the person skilled in the art by the acronym "SiProt" ("Silicon Protection") (FIG. 9).

This bilayer serves to protect the zones (not represented in the figures) of the integrated circuit which must not be silicided. The bilayer 4, 5 is thereafter etched so as to uncover the regions to be silicided and form a fifth insulating layer CI5 resting on the flanks of a fourth insulating layer CI4 itself resting on the flanks of the second insulating layer CI2.

Figure 10:
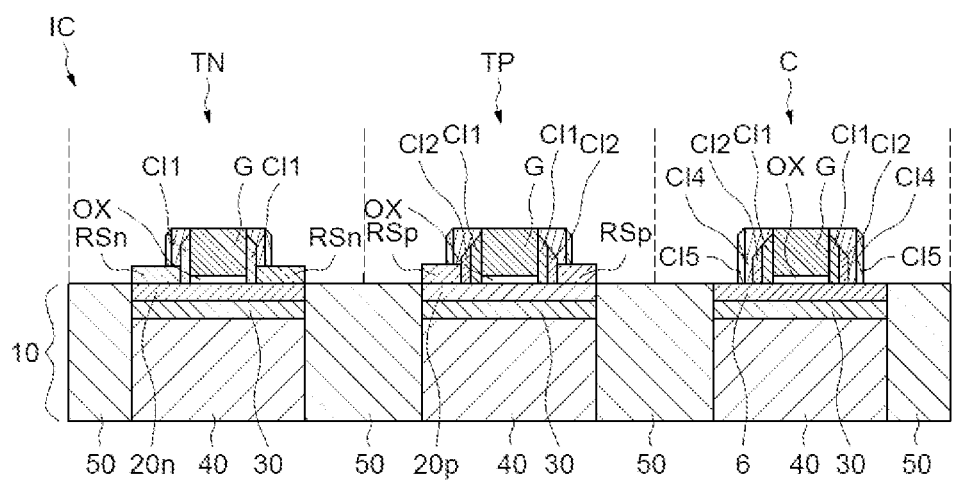

The regions envisaged for silicidation comprise the gate regions G, the elevated source and drain regions RSn and RSp of the nMOS transistors TN and pMOS transistors TP and the zone 6 of the semiconductor film 20n, situated alongside the insulating lateral layers (CI1, CI2, CI4 and CI5) and resting on the flanks of the gate region G of the capacitor C (FIG. 10).

The silicidation method is performed thereafter in a conventional manner known per se, by depositing a metallic layer, for example a nickel-platinum alloy, on the structure of FIG. 10 and then by thermal annealing to form a metal silicide, for example NiPtSi.

Figure 11:
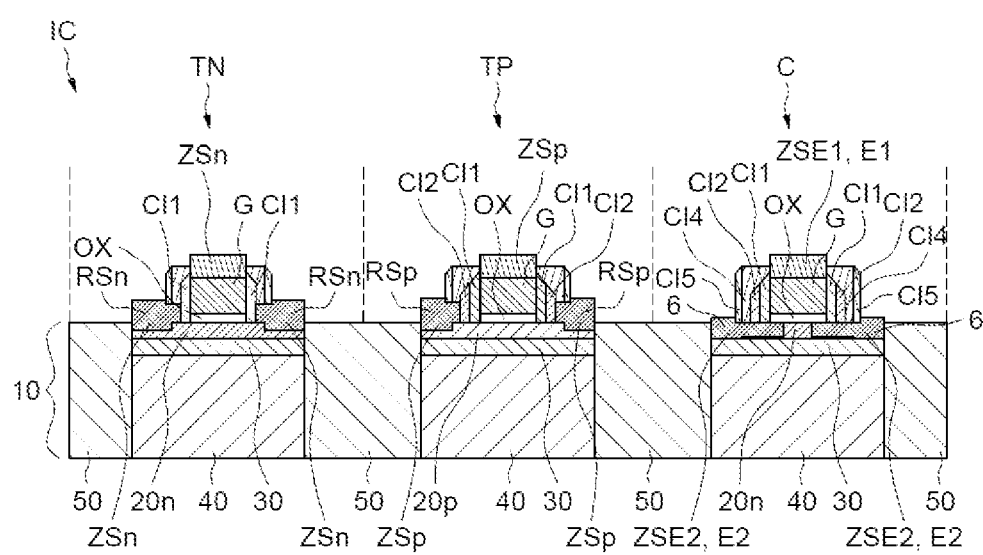

There are then obtained (FIG. 11) silicided zones ZSn and ZSp on the transistors TN and TP, a silicided zone ZSE1 on the gate G of the capacitor C and two silicided zones ZSE2 in the zone 6 of the semiconductor film.

As there has been no epitaxy of semiconductor material on the zone 6 of the semiconductor film 20n of the capacitor C, the metallic silicide ZSE2 formed in the zone 6 extends at least partially under the dielectric layer OX of the capacitor C.

In a case of a short gate, for example, less than 20 nm, it is possible to carry out a silicidation which extends fully under the dielectric layer OX.

Furthermore, the gate regions G can be fully silicided, known per se by the person skilled in the art.

Therefore, the capacitor C comprises a first electrode region E1 obtained by at least partial silicidation ZSE1 of the insulated gate region and a second electrode region E2 obtained by silicidation ZSE2 of the zone 6 of the semiconductor film 20n of the capacitor C. The silicided zones ZSE2 extend at least partially under the dielectric layer OX.

Consequently, the resistance between the two metallic electrode regions of the capacitor C can be reduced so as to decrease de facto the voltage, the breakdown time, and also the reading voltage of the memory cell especially in the case of a programmed memory cell with the capacitor C having suffered breakdown.

What is claimed is:

1. A method for forming a semiconductor device, the method comprising:
   forming a dielectric layer over a semiconductor film of a silicon-on-insulator substrate;
   forming a gate region dielectric layer so that the dielectric layer is disposed between the gate region and the semiconductor film;
   forming an insulating lateral region along a sidewall of the gate region;
   forming a first electrode region by partially silicide in the gate region; and
   forming a second electrode region by silicide in a zone of the semiconductor film located alongside the insulating lateral region without having previously undertaken an epitaxy of semiconductor material on the zone of the semiconductor film, the silicide of the second electrode region extending at least partially under the gate region so that the first electrode region, the dielectric layer and the silicide of the second electrode region form a capacitor.

2. The method according to claim 1, further comprising forming a MOS transistor at the semiconductor film laterally spaced from the gate region, the MOS transistor having elevated source and drain regions comprising an epitaxy of a semiconductor material on the semiconductor film.

3. The method according to claim 1, wherein the silicon-on-insulator substrate comprises a fully depleted silicon-on-insulator (FDSOI) substrate.

4. The method according to claim 1, wherein forming the second electrode region comprises forming an electrode region that underlies all of the gate region.

5. The method according to claim 2, wherein forming the MOS transistor comprises performing an epitaxy step to form the elevated source and drain regions and forming an insulating layer to protect the zone of the semiconductor film during epitaxy step.

6. An integrated circuit comprising:
   a silicon-on-insulator substrate that includes a semiconductor film located above a buried insulating layer;
   a one-time-programmable memory cell comprising an MOS capacitor comprising:
      a first electrode region that comprises a gate region that is partially silicided and flanked by an insulating lateral region;
      a dielectric layer between the gate region and the semiconductor film; and
      a second electrode region that includes a silicided zone of the semiconductor film, which is located alongside the insulating lateral region and extends at least partially under the dielectric layer and the gate region.

7. The integrated circuit according to claim 6, wherein the silicided zone of the semiconductor film extends fully under the dielectric layer.

8. The integrated circuit according to claim 6, further comprising a MOS transistor having elevated source and drain regions, the MOS transistor being laterally spaced from the one-time-programmable memory cell.

9. The integrated circuit according to claim 6, wherein the one-time-programmable memory cell includes no elevated semiconductor regions.

10. The integrated circuit according to claim 6, wherein the silicon-on-insulator substrate comprises a fully depleted silicon on insulator (FDSOI) substrate.

11. The integrated circuit according to claim 8, further comprising a second MOS transistor having elevated source and drain regions, the second MOS transistor being laterally spaced from the one-time-programmable memory cell and the MOS transistor, wherein the MOS transistor and the second MOS transistor have opposite conductivity types.

12. An integrated circuit comprising:
   a semiconductor layer;
   an MOS transistor disposed at a surface of the semiconductor layer; and
   an MOS capacitor disposed at the surface of the semiconductor layer laterally spaced from the MOS transistor;
   the MOS transistor comprising:
      a gate region;
      a dielectric layer between the gate region and the semiconductor layer;
      a channel region within the semiconductor layer beneath the dielectric layer;
      a source region within the semiconductor layer adjacent a first edge of the gate region; and
      a drain region within the semiconductor layer adjacent a second edge of the gate region, the drain region spaced from the source region by a channel region; and
   the MOS capacitor comprising:
      a first electrode region that comprises a gate region that is partially silicided;
      a dielectric layer between the gate region and the semiconductor layer; and
      a second electrode region that includes a silicided zone of the semiconductor layer that extends at least partially beneath the dielectric layer and the gate region.

13. The integrated circuit according to claim 12, wherein the source region comprises an elevated source region that is partially silicided and wherein the drain region comprises an elevated drain region that is partially silicided.

14. The integrated circuit according to claim 12, wherein the silicided zone of the semiconductor layer extends fully under the dielectric layer.

15. The integrated circuit according to claim 12, wherein the semiconductor layer comprises a semiconductor film of a silicon-on-insulator substrate.

16. The integrated circuit according to claim 12, wherein the MOS capacitor comprises a one-time-programmable memory cell.

17. The integrated circuit according to claim 13, wherein the MOS capacitor comprises no elevated regions.

18. The integrated circuit according to claim 15, wherein the silicon-on-insulator substrate comprises a fully depleted silicon on insulator (FDSOI) substrate.

19. A method of making a semiconductor device, the method comprising:
forming a gate region for a MOS transistor and a gate region for an MOS capacitor over and insulated from a semiconductor layer;
forming a mask over the gate region of the MOS capacitor;
forming an elevated source region and an elevated drain region adjacent opposite edges of the gate region of the MOS transistor; and
performing a silicide process to form a first silicide region over the gate region of the MOS transistor, a second silicide region over the elevated source region, a third silicide region over the elevated drain region, a fourth silicide region over the gate region of the MOS capacitor, a fifth silicide region in a first zone of the semiconductor layer adjacent a first edge of the gate region of the MOS capacitor, and a sixth silicide region and a second zone of the semiconductor layer adjacent a second edge of the gate region of the MOS capacitor, the fifth and sixth silicide regions both extending at least partially under the gate region of the MOS capacitor.

20. The method according to claim 19, wherein the fifth silicide region adjoins the sixth silicide region under the gate region of the MOS capacitor.

21. The method according to claim 19, wherein the semiconductor layer comprises semiconductor film of a fully depleted silicon on insulator (FDSOI) substrate.

* * * * *